(12) United States Patent
Kang

(10) Patent No.: US 6,218,273 B1
(45) Date of Patent: Apr. 17, 2001

(54) METHODS OF FORMING ISOLATION TRENCHES IN INTEGRATED CIRCUITS USING PROTRUDING INSULATING LAYERS

(75) Inventor: Woo-tag Kang, Kyonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/273,868

(22) Filed: Mar. 22, 1999

(30) Foreign Application Priority Data

Mar. 25, 1998 (KR) .................................................. 98-10256

(51) Int. Cl.$^7$ .................................................. C30B 25/18
(52) U.S. Cl. .......................... 438/590; 438/591; 438/592; 117/94
(58) Field of Search .................................... 438/590, 591, 438/592; 117/94

(56) References Cited

U.S. PATENT DOCUMENTS

| 4,250,568 | * | 2/1981 | Grassl | 365/149 |
| 4,929,302 | * | 5/1990 | Valette | 156/657 |
| 5,293,063 | * | 3/1994 | Anceau | 257/653 |
| 5,448,180 | * | 9/1995 | Kienzler et al. | 326/15 |
| 5,859,459 | * | 1/1999 | Ikeda | 257/374 |
| 5,989,997 | * | 11/1999 | Lin et al. | 438/622 |
| 6,037,261 | * | 3/2000 | Jost et al. | 438/696 |
| 6,040,609 | * | 3/2000 | Frisina et al. | 257/391 |

\* cited by examiner

*Primary Examiner*—Robert Kunemund
(74) *Attorney, Agent, or Firm*—Myers Bigel Sibley & Sajovec

(57) ABSTRACT

An isolation trench is formed from a first isolation trench in an integrated circuit substrate between active regions in the integrated circuit substrate. An insulating layer is formed in the first isolation trench, wherein the insulating layer includes a portion that protrudes from the first isolation trench. A second isolation trench is formed on the first isolation trench and self-aligned to the active regions in the integrated circuit substrate, wherein the second isolation trench includes the protruding portion of the insulating layer. By forming the isolation trench in two steps, the isolation trench may be formed to the appropriate depth without developing a seam in the insulating layer. In particular, the first isolation trench is formed to a depth and filled with the insulating layer which protrudes from the trench. The second isolation trench is built up around the protruding insulating layer to provide the total depth for adequate isolation of the active areas. The isolation trench may thereby provide improved reliability of the integrated circuit.

21 Claims, 6 Drawing Sheets

METHODS OF FORMING ISOLATION TRENCHES IN INTEGRATED CIRCUITS USING PROTRUDING INSULATING LAYERS

FIELD OF THE INVENTION

The present invention relates to the field of integrated circuit fabrication in general and more particularly to shallow trench isolation in integrated circuits

BACKGROUND OF THE INVENTION

In integrated circuits, such as integrated circuit memories, an isolation region may be provided between active regions of the integrated circuit. Consequently, the size of the isolation region may affect the level of integration of the integrated circuit. It is known to use processes such as Selective Polysilicon Oxidation (SEPOX), Recessed Polysilicon Spacer (RPSL), or Local Oxidation of Silicon (LOCOS). These processes may, however, exhibit problems that affect the reliability of the integrated circuit. For example, the LOCOS process may exhibit "bird's beak" at boundaries between a pad oxide film and a nitride film, thereby possibly affecting the reliability of the integrated circuit.

It is also known to form shallow isolation trenches to a depth of about 2500 Angstroms (Å). If the depth of trench is less than 2500 Å, the degree of isolation may not be sufficient. However, the need to achieve high levels of integration in the integrated circuit may limit the width of the trench which may limit the aspect ratio of the isolation trench (trench depth/trench width). In other words, as the width of the trench diminishes, the aspect ratio of the isolation trench may also increase. Accordingly, it may be difficult to fill the trench with the isolation material. In particular, a high aspect ratio of the trench may promote the formation of seams in the isolation trench which may reduce the reliability of the integrated circuit.

It is known to provide trench isolation in an integrated circuit substrate 11 using high density low pressure plasma Chemical Vapor Deposition (CVD) to reduce the seams, as shown in FIGS. 1A through 1F. According to FIG. 1A, a pad oxide film 13 of thickness 100 Å and a nitride film 15 of thickness 2000 Å are formed on an integrated circuit substrate 11 subsequently. A high temperature oxide film 17 is formed on the nitride film 15.

The high temperature oxide film 17 is patterned using photoresist as a mask and etched until portions of the surface of nitride film 15 are exposed whereafter the photoresist is removed. The remaining portion of the high temperature oxide film 17 is used as an etch mask to remove exposed portions of the nitride film 15, and the pad oxide film 13. The resulting structure is used to etch the integrated circuit substrate 11 to form a trench 19 in the integrated circuit substrate 11 of a depth of about 2500 Å.

As shown in FIG. 1B, a first oxide film 21 is thermally grown on the bottom and sides of the isolation trench 19 to a thickness in a range between 100 and 500 Å. The first oxide film 21 may repair some of the damage done to the bottom and sides of the isolation trench 19 during etching. Then, the first oxide film 21 is plasma-treated and a first Undoped Silicate Glass (USG) film 23 is formed to a thickness of about 1500 Å using a tetra-ethyl ortho silicate (TEOS) CVD process as shown in FIG. 1C. The first oxide film 21 is plasma treated to promote a uniform thickness for the first USG film 23 formed on the first oxide film 21 in the isolation trench 19 by preventing a portion of the first USG film 23 near the top of the isolation trench 19 from having a greater thickness than other portions of that relying upon the surface state of the underlying first oxide film 21.

As shown in FIG. 1D, the first USG film 23 is etched back using an argon sputtering process thereby leaving the first USG film 23 on the first oxide film 21 in the isolation trench 19 and the portion of the first USG film 23 near the top of the isolation trench 19 having a predetermined slope. Removing the portion of the first USG film 23 near the top of the isolation trench 19 may promote the filling of an insulating film from the trench 19 during subsequent steps of the process.

As shown in FIG. 1E, a second USG film 25 is formed on the high temperature oxide film 17 and in the isolation trench 19 to a thickness in range of 5000 to 7000 Å and a second oxide film 27 is formed on the second USG film 25 by Plasma Enhanced Tetra Ethyl Ortho Silicate (PETEOS) CVD. The first and second USG films 23,25 are densified by heating to a temperature of about 1000° C. for an hour in a nitrogen environment.

As shown in FIG. 1F, the isolation trench 19 is planarized to expose the pad oxide film 13 using CMP. The pad oxide film 13 is wet etched to expose the active areas of the integrated circuit substrate 11.

Unfortunately, as the aspect ratio of the isolation trench 19 increases it may be increasingly difficult to fill the second USG film 25 in the isolation trench 19, so that adequate isolation can not be provided between the active areas of the integrated circuit substrate 11 without plasma-treating the first oxide film 21 (which may complicate the process of forming the trench isolation structure).

SUMMARY OF THE INVENTION

It is, therefore, an object of the present invention to provide for an improvement in the fabrication of integrated circuits.

It is another object of the present invention to allow further reduction in the complexity of the fabrication of integrated circuits.

It is a further object of the present invention to allow improvement in the reliability of integrated circuits so formed.

These and other objects are provided by forming a first isolation trench in the integrated circuit substrate between active regions in the integrated circuit substrate. An insulating layer is formed in the first isolation trench, wherein the insulating layer includes a portion that protrudes from the first isolation trench. A second isolation trench is formed on the first isolation trench self-aligned to the active regions in the integrated circuit substrate, wherein the second isolation trench includes the protruding portion of the insulating layer.

The protruding portion of the insulating material that remains adds to the depth of the isolation trench, thereby allowing the depth of the first isolation trench to be less than in conventional integrated circuit fabrication which may avoid the development of a seam in the insulating layer without a plasma treatment step. Consequently, the present invention may provide a simpler method of fabricating isolation trenches in integrated circuits. In contrast, in some conventional methods the protruding portion of the insulating layer is removed which may require the isolation trench to be formed to an initial depth which provides adequate insulation.

In one embodiment, an epitaxial layer is grown on the integrated circuit substrate around the protruding portion of the insulating layer to a thickness about equal to the depth of the protruding portion of the insulating layer.

DETAILED DESCRIPTION OF PREFERRED EMBODIMENTS OF THE INVENTION

Figure 1A:
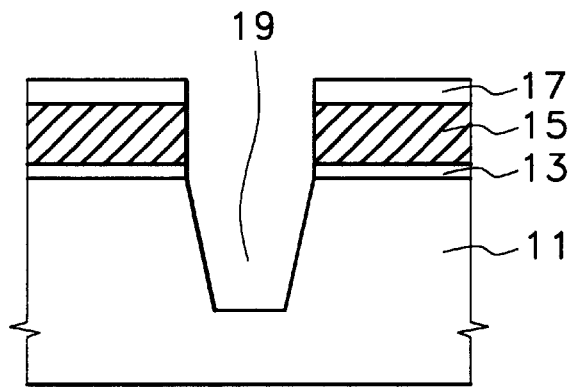
FIGS. 1A through 1F are enlarged cross-sectional views of integrated circuit substrates that illustrate the fabrication of isolation trenches according to the prior art.
Figure 1B:
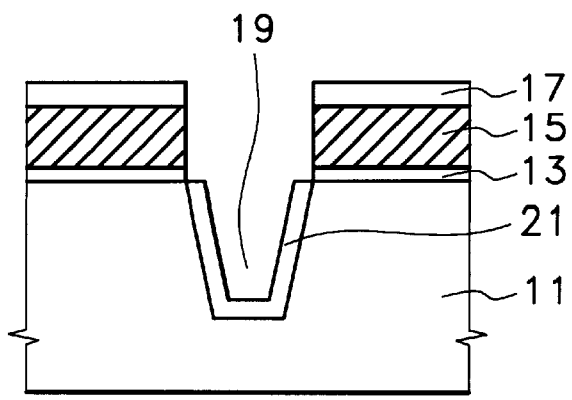
Figure 1C:
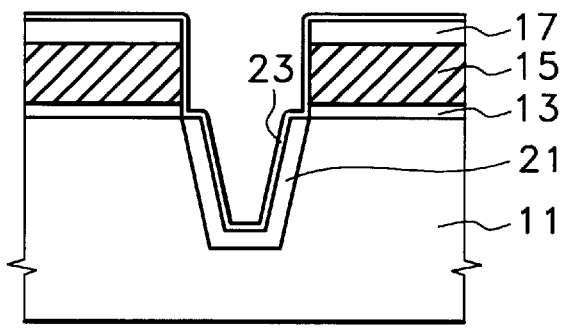
Figure 1D:
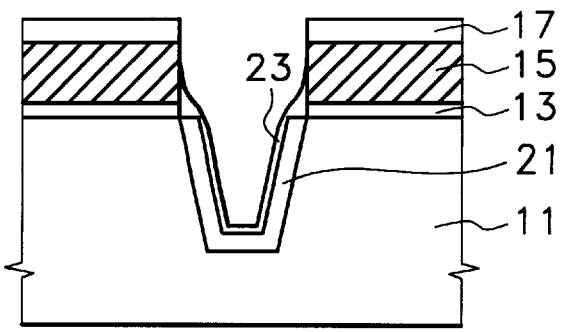
Figure 1E:
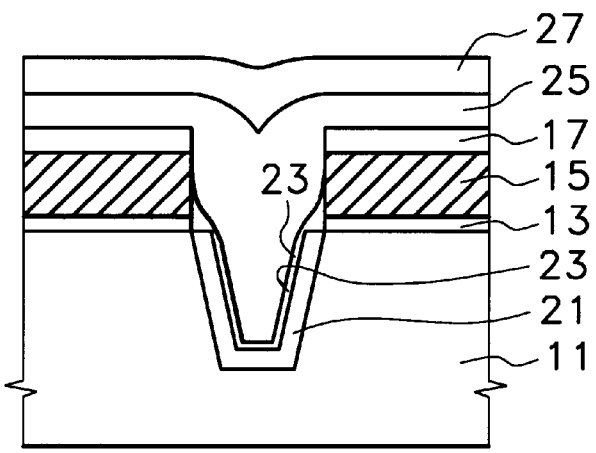
Figure 1F:
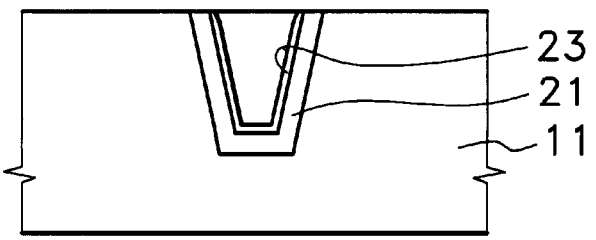

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. Like numbers refer to like elements throughout.

Figure 2A:
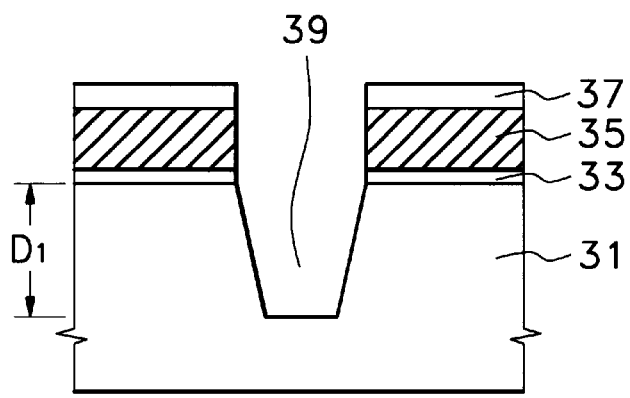
FIGS. 2A through 2F are enlarged cross-sectional views of integrated circuit substrates that illustrate the fabrication of isolation trenches according to the present invention.

As shown in FIG. 2A, a pad oxide film 33 of thickness of about 100 Angstroms (Å) and a nitride film 35 of a thickness of about 2000 Å are formed on an integrated circuit substrate 31. A high temperature oxide film 37 is formed on the nitride film 35. The high temperature oxide film 37 is patterned using photoresist as a mask and etched until the portions of surface of nitride film 35 are exposed, whereafter the photoresist is removed. The remaining portion of the high temperature oxide film 37 is used as an etch mask to remove exposed portions of the nitride film 35 and the pad oxide film 33. The resulting structure is used to etch the integrated circuit substrate 33 to form an initial trench 39 in the integrated circuit substrate 31 to a depth of about 1500 Å.

Figure 2B:
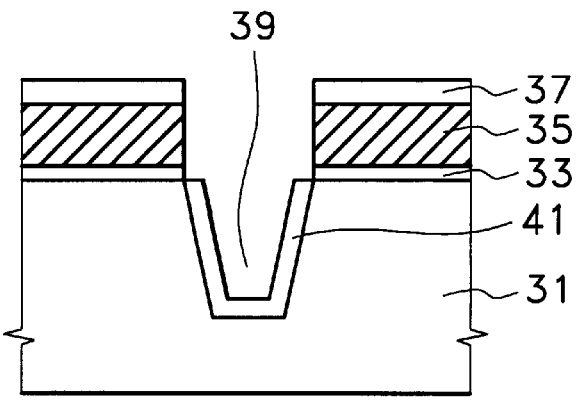

As shown in FIG. 2B an oxide film 41 is thermally grown on the bottom and lower sidewall of the initial trench 39 to a thickness of about 240 Å. The oxide film 41 may repair some of the damage done to the bottom and lower sidewall of the initial trench 39 during etching.

Figure 2C:
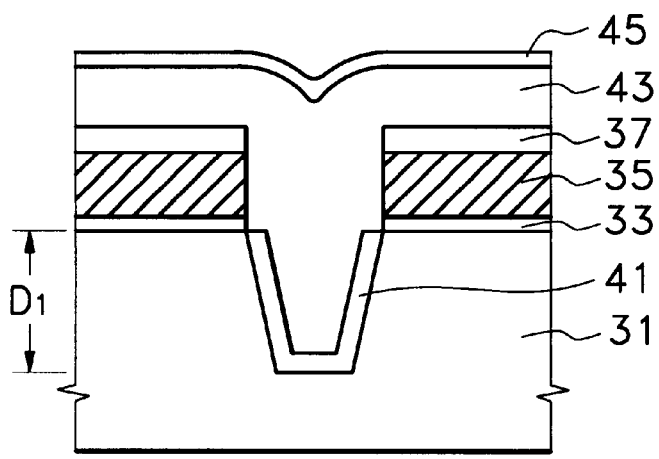

As shown in FIG. 2C an insulating layer 43, such as Undoped Silicate Glass (USG), is formed on the high temperature oxide film 37 and in the initial trench 39 to a thickness of about 5000 Å using ozone TEOS CVD. The insulating layer 43 comprises an insulating material having a high selective etch rate with respect to the nitride film 35. A second oxide film 45 is formed on the insulating layer 43 to a thickness of about 500 Å and densified by heating to about 1000° C. for an hour in a nitrogen environment.

Figure 2D:
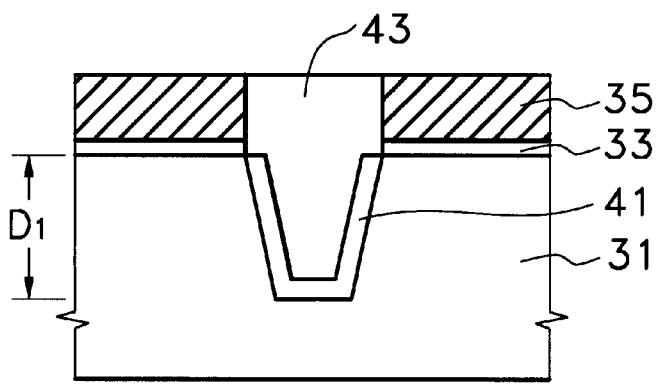

As shown in FIG. 2D, the second oxide film 45, the insulating layer 43, and the high temperature oxide film 37 are removed by Chemical Mechanical Polishing (CMP) to expose the nitride film 35 such that the dimension $D_1$ from the top surface of the integrated circuit substrate 31 to the bottom of the initial trench 39 is about 1500 Å. The nitride film 35 and the pad oxide film 33 are removed from the integrated circuit substrate 31 together with about 500 Å of the insulating layer 43 using a wet etch process as shown in FIG. 2D.

Figure 2E:
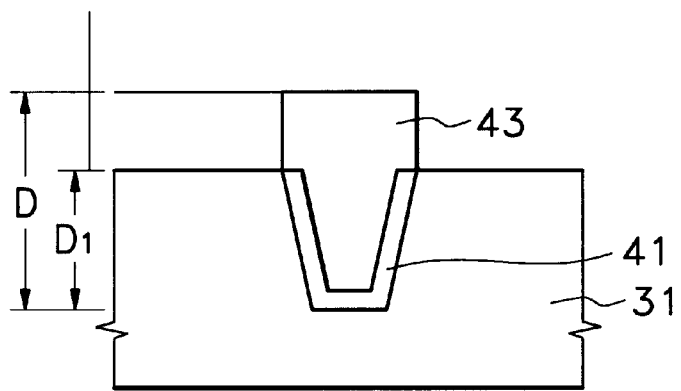
Figure 2F:
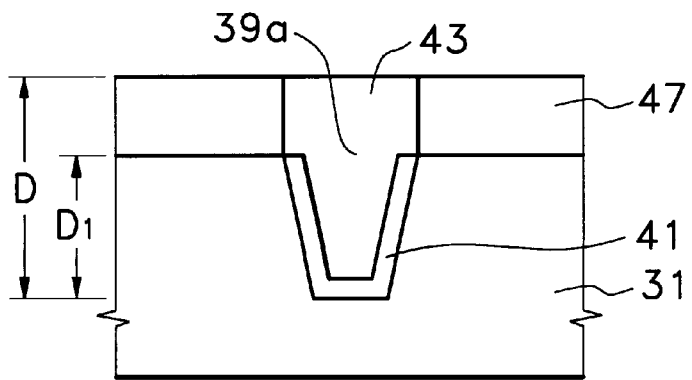

As shown in FIG. 2E, the nitride film 35 is then removed. The removal of the nitride film 35 causes a portion of the insulating layer 43 to protrude from the initial trench 39. The dimension D from the top of the protruding portion of the insulating layer 43 to the bottom of the initial trench 39 is about 2500 Å. In other words, the protruding portion of the insulating layer 43 adds about 1000 Å to the dimension $D_1$ described above. As shown in FIG. 2F, a layer 47, such as an epitaxial layer, is formed on the integrated circuit substrate 31 self-aligned to the active regions in the integrated circuit substrate, thereby forming a final trench 39a formed to a depth of about 2500 Å. In a preferred embodiment, the layer 47 is an epitaxial layer comprising an impurity-doped single crystal silicon layer.

According to the present invention, by forming the isolation trench from a first isolation trench formed on and aligned to a second isolation trench, the isolation trench may be formed to the appropriate depth without developing a seam in the insulating layer. In particular, the first isolation trench is formed to a depth and filled with the insulating layer which includes a portion that protrudes from the first trench. The second isolation trench is formed by building up a layer on the integrated circuit substrate around the protruding portion of the insulating layer to provide the total depth for adequate isolation of the active areas. The isolation trench may thereby provide improved reliability of the integrated circuit. In addition, plasma-treating process may be unnecessary thereby allowing a simplified process to form the trench isolation according to the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an isolation trench in an integrated circuit substrate, the method comprising the steps of:
    forming a first isolation trench within the integrated circuit substrate between active regions in the integrated circuit substrate;
    forming an insulating layer in the first isolation trench that is within the integrated circuit substrate, wherein the insulating layer includes a portion that protrudes from the first isolation trench beyond the integrated circuit substrate; and
    forming a second isolation trench on the first isolation trench and self-aligned to the active regions in the integrated circuit substrate, wherein the second isolation trench includes the protruding portion of the insulating layer.

2. The method of claim 1, wherein the step of forming a second isolation trench comprises the step of forming a layer on the integrated circuit substrate around the protruding portion of the insulating layer.

3. The method of claim 2, wherein the step of forming a layer comprises the step of growing an epitaxial layer on the integrated circuit substrate.

4. The method of claim 2, wherein the step of forming a layer comprises the step of forming a layer to a thickness about equal to the thickness of the protruding portion of the insulating layer.

5. The method of claim 3, wherein the step of growing an epitaxial layer comprises the step of growing an impurity doped single crystal silicon layer.

6. The method of claim 4, wherein the step of forming comprises the step of forming the layer to a thickness of about 1000 Å.

7. The method of claim 1, wherein the step of forming a first isolation trench comprises the step of forming the first isolation trench within the integrated circuit substrate to a depth of 1500 Å measured from the bottom of the first isolation trench to the surface of the integrated circuit substrate.

8. The method of claim 1, wherein the step of forming a first isolation trench comprises the steps of:

forming an etch stopping layer on the integrated circuit substrate; and etching the etch stopping layer and the integrated substrate to form first isolation trench therein.

9. The method of claim 8, wherein the step of forming an insulating layer comprises the steps of:

forming an insulating layer in the first isolation trench and on the etch stopping layer;

removing the insulating layer and the etch stopping layer until the dimension measured from the bottom of the first isolation trench to the surface of the etch stopping layer is about 1500 Å; and removing the etch stopping layer to expose the portion of the insulating layer that protrudes from integrated circuit substrate.

10. The method of claim 9, wherein the step of removing the etch stopping layer comprises the step of removing the etch stopping layer until a portion of the insulation layer protrudes that measures about 1000 Å from the surface of the integrated circuit substrate to the surface of the protruding portion is exposed.

11. A method of forming an isolation trench comprising the steps of:

forming an isolation trench to a first depth in an active area of a semiconductor substrate;

forming an insulating layer to a second depth in the isolation trench and exposing the active area of the semiconductor substrate, wherein the second depth is greater than the first depth; and growing an epitaxial layer on the exposed active area self aligned to the active areas of the semiconductor substrate.

12. The method of claim 11, wherein the step of forming an insulating layer comprises the steps of:

depositing the insulating layer on the semiconductor substrate and in the isolation trench so as to fill the isolation trench with the insulating layer;

planarizing the insulating layer; and removing a portion of the planarized insulating layer to expose the active area of the semiconductor substrate.

13. The method of claim 12, wherein the step of depositing further comprises the steps of:

depositing a protective film onto said insulting layer for use in the isolation trench to protect said insulating layer; and densifying the protected insulating layer.

14. The method of claim 13, wherein the step of depositing comprises the step of depositing an oxide film.

15. The method of claim 13, the step of depositing is preceded by the step of forming an etching damage preventive film on bottom and side surfaces of the isolation trench.

16. The method of claim 15, wherein the step of forming an etching damage preventive film comprises the step of forming a thermally grown oxide film.

17. The method of claim 12, wherein the step of planarizing comprises the step of planarizing the insulating layer using chemical-mechanical polishing.

18. The method of claim 11, wherein the step of forming an insulating layer comprises the step of forming an undoped silicate glass film.

19. The method of claim 11, wherein the semiconductor substrate is a single crystal silicon substrate; and wherein the step of growing comprises the step of growing an impurity doped single crystal silicon layer.

20. A method of forming a trench in a semiconductor circuit substrate, the method comprising the steps of:

forming a trench within the semiconductor circuit substrate;

forming an insulating layer in the trench within the semiconductor circuit substrate that protrudes beyond the trench within the semiconductor substrate to define a protruding portion of the insulating layer beyond the semiconductor circuit substrate; and growing the semiconductor circuit substrate around the protruding portion of the insulating layer.

21. The method of claim 20, wherein the step of growing comprises the step of epitaxially growing the semiconductor substrate around the protruding portion of the insulating layer to a thickness about equal to the thickness of the protruding portion.

* * * * *